July 6, 1965 A. OTTMANN ETAL 3,193,739

SEMICONDUCTOR DEVICE HAVING FOUR-LAYER COMPONENTS FOR OBTAINING NEGATIVE CURRENT-VOLTAGE CHARACTERISTICS

Filed May 15, 1962 2 Sheets-Sheet 1

July 6, 1965 A. OTTMANN ETAL 3,193,739

SEMICONDUCTOR DEVICE HAVING FOUR-LAYER COMPONENTS
FOR OBTAINING NEGATIVE CURRENT-VOLTAGE
CHARACTERISTICS

Filed May 15, 1962 2 Sheets-Sheet 2

United States Patent Office 3,193,739

Patented July 6, 1965

3,193,739
SEMICONDUCTOR DEVICE HAVING FOUR-LAYER COMPONENTS FOR OBTAINING NEGATIVE CURRENT-VOLTAGE CHARACTERISTICS

Alfred Ottmann and Herbert Goetzeler, Munich, Germany, assignors to Siemens & Halske Aktiengesellschaft, Berlin, Germany, a corporation of Germany Filed May 15, 1962, Ser. No. 194,861
10 Claims. (Cl. 317—234)

Figure 1:
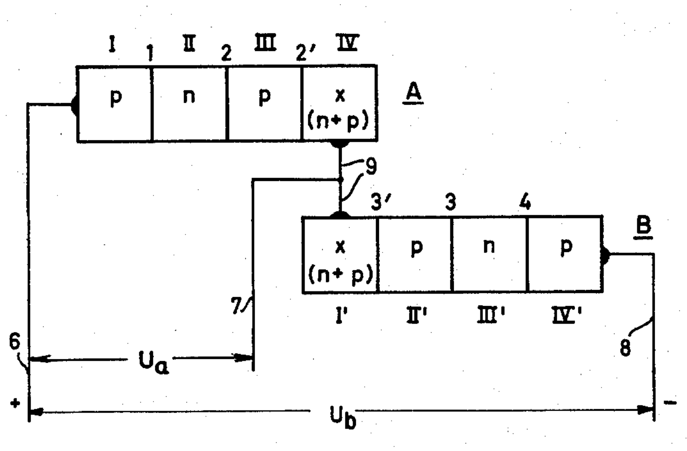

Our invention relates to semiconductor devices of the four-layer junction type in which the four sequential layers of zones of a semiconductor crystal have alternately different type of conductance. More particularly, our invention relates to a four-layer semiconductor device of the type disclosed in the copending application Serial No. 821,908, filed June 22, 1959, of H. Dorendorf et al., now Patent 3,119,026, assigned to the assignee of the present invention, in which the four layers of the device, alternatively containing acceptor and donor impurity atoms have one of the two outermost layers doped with impurity atoms of both types, namely, with acceptors as well as donors. The concentration of those dopant atoms that produce a conductance type opposed to that of the next adjacent intermediate layer being so chosen that this particular outer layer injects minority carriers into the adjacent intermediate layer in one direction but exhibits virtually no blocking action in the other direction.

It is an object of our invention to devise improved electronic semiconductor devices generally of the above-mentioned type that are more versatile as to their applicability for various controlling, regulating, switching, amplifying or other electrical purposes than the four-layer devices heretofore available. Another object of our invention is to provide an electronic semiconductor device exhibiting a negative resistance that can be used with respectively different current-voltage characteristics depending upon the particular circuit connection of the device.

According to our invention, we provide a semiconductor device that essentially comprises two four-layer crystal members, each having its four layers or zones doped for alternately different type of conductance, with the exception of one of the two outer layers which is doped with both p-type and n-type impurity atoms of the concentration required for having this outer zone inject minority carriers into the adjacent intermediate zone in one direction while having virtually no blocking action in the other direction. Furthermore, one of the two outer zones of each of the two members is in electrically conducting connection with one of the outer zones of the other member, and both are jointly contacted by an external terminal or lead at the connection point.

According to a more specific feature of our invention, the two four-layer semiconductor members are so joined with each other that the intermediate layers adjacent to the electrically interconnected outer zones of the respective members have the same type of conductance.

According to another, alternative feature of our invention, the connection between the two component semiconductor members of the device is such that the intermediate zones adjacent to the interconnected outer zones in the respective members have mutually opposed conductance types.

The above-mentioned and other objects, advantages and features of our invention, said features being set forth with particularity in the claims annexed hereto will be apparent from, and will be described in, the following with reference to the accompanying drawings in which:

FIG. 1 shows schematically a three-terminal semi-conductor device according to the invention by way of example.

Figure 1A:
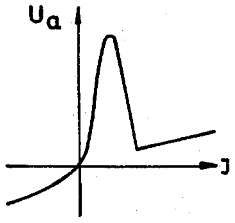
Figure 1B:
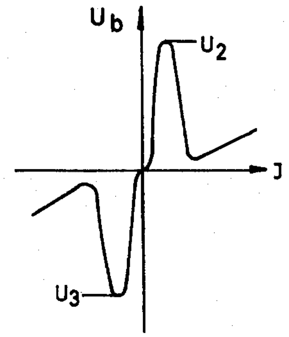
Figure 1C:
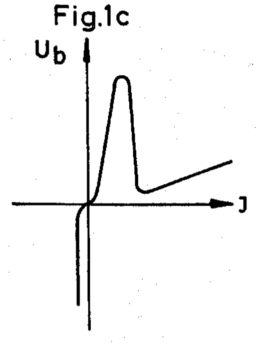

FIGS. 1*a*, 1*b*, 1*c* are explanatory and show different current-voltage characteristics selectively obtainable with a device according to FIG. 1.

Figure 2:
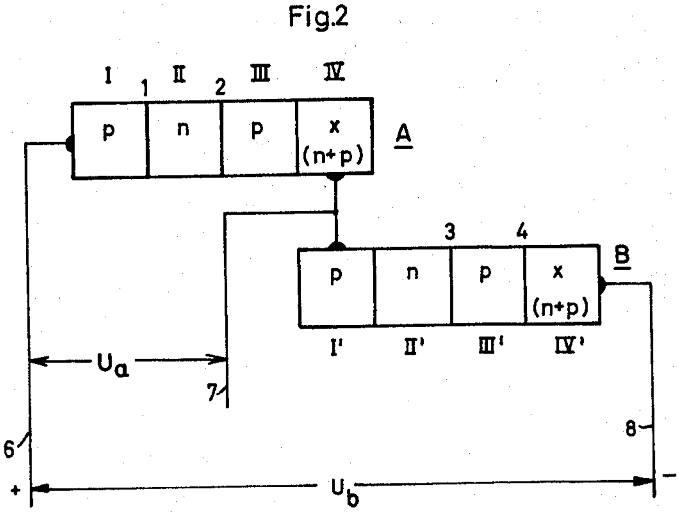
Figure 3:
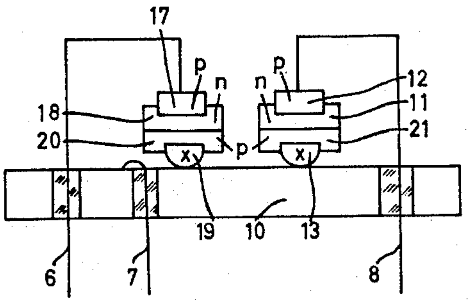

FIG. 2 shows by way of example another embodiment of the device according to the invention; and FIG. 3 illustrates schematically a preferred design of a semiconductor device according to the invention.

The device according to FIG. 1 comprises two semiconductor components A and B consisting preferably of mono-crystalline silicon, although germanium and other semiconductor substances are likewise applicable. Each of the two component members, schematically shown as separate crystals although they may also be combined with each other, comprises four-layers or zones I to IV and I′ to IV′. Each of these zones has the type of conductance indicated in FIG. 1. For example, zone I has p-type conductance, being doped with acceptor atoms. Zone II has n-type conductance, being doped with donor atoms, etc. Consequently, a p-n junction is formed at 1 between zones I and II. Another p-n junction is formed at 2 between zones II and III. Corresponding p-n junctions exist in component member B at 3 and 4. The individual zones are doped and the junctions are produced, for example, by diffusion and alloying as described in the above-mentioned copending application, Serial No. 821,908, for example. Each of the zones IV and I′, denoted by *x*, contain n-type as well as p-type impurity atoms in the above-mentioned concentration. As is explained in the application Serial No. 821,908, the p-x junctions at 2′ and 3′ exhibit almost no blocking action irrespective of the poling of the voltage impressed between the terminal leads 6 and 7 or the terminal leads 7 and 8. The p-x junctions are virtually ohmic contacts and do not constitute any additional p-n junctions.

It will be noted that in this embodiment the outer zone IV of member A and the outer zone I′ of B conductively connected with each other by the contacted connection 9, contain donor as well as acceptor atoms, and that the adjacent intermediate zones III and II′ have both the same type, namely, p-type conductance.

When a voltage is applied between the terminal leads 6 and 7 or 7 and 8, such as the voltage $U_a$ between leads 6 and 7 the device has a current-voltage characteristic as typified by the one shown in FIG. 1*a*, corresponding to the characteristic also described in the abovementioned copending application, Serial No. 821,908. When a voltage $U_b$ is applied between the terminal leads 6 and 8 with the positive pole at lead 6 and the negative pole at lead 8 as indicated in FIG. 1, the p-n junctions 2 and 4 have blocking action. Since the breakdown voltages $U_1$ and $U_4$ of the respective two outer junctions 1 and 4 in a device according to the invention are much lower (about 1 volt) than the breakdown voltages $U_2$ and $U_3$ of the two respective middle junctions 2 and 3, the junction 4 will break down first. The electrons now injected from zone IV′ into the adjacent zone III′ can pass virtually unimpeded through zones II′, I′ and the conducting connection 9 into the zone III. As a result the injection of minority carriers in zone III, and hence the yield from zone IV′, is increased. The junctions 1 and 4 can be considered as emitters which inject the minority carriers into the zones II and III. With increasing external voltage $U_b$, the yield and thus also the current amplification of the two injecting junctions increases. When thus the sum of the two current amplifications attains the unity value, the device becomes instable. This occurs at a given value of the external voltage $U_b=U_2$ which is designated as the breakdown voltage of the junction 2. When the voltage $U_b$ is poled in the reverse sense, the junctions 1 and 3 assume blocking action and analogous conditions prevail. The breakdown of junction 1 takes place first on account of its smaller breakdown voltage, and the electrons injected from zone I to zone II increase the injection of minority carriers into the zone II'. The yield of junctions 1 and 4 increases with increasing external voltage $U_b$; and the breakdown voltage of junction 3 is reached for $U_b=U_3$ so that the device becomes instable. Consequently, when applying a voltage of alternating polarity between the terminal leads 6 and 8, a characteristic as shown in FIG. 1*b* is obtained.

In the case represented by the characteristic of FIG. 1*b*: $U_2=U_3$. This, of course, is not necessarily required. The breakdown voltages of the two junctions 2 and 3 may also have different respective magnitudes. If $U_3$ particularly is much larger than $U_2$, the characteristic shown in FIG. 1*c* is obtained. This is the known current-voltage characteristic of a switching diode. The current load permissible for the device is then limited because at excessively large currents the characteristic of FIG. 1*c* converts to a characteristic according to FIG. 1*b* except for respectively different breakdown voltages.

Consequently, the device according to the invention constitutes a circuit component which affords obtaining three different operating characteristics as exemplified by FIGS. 1*a*, 1*b* and 1*c*, simply by varying the connecting electrodes or leads 6, 7 and 8.

The invention obviously is not limited to the particular features described above with reference to the embodiment exemplified by FIG. 1. The two semiconductor components of the device, for example, may possess different zone sequences. Thus, the zone I of an x-n-p-n sequence may be connected with the zone IV' of an n-p-n-x sequence, or the zone IV of a p-n-p-x sequence may be connected with the zone I' of an x-p-n-p sequence. Furthermore, in a device according to the invention each of the electrically interconnected outer zones may be doped only with impurity atoms that produce the conductance type opposed to that of the adjacent intermediate zone. Thus, for example, in FIG. 1 the zone I may be connected with the zone IV', or the zone IV of an x-n-p-n sequence may be connected with the zone I' of an n-p-n-x sequence. Also applicable is an electric connection of the zone IV of a p-n-p-x sequence with the zone I of an n-p-n-x sequence, this being an electric connection of the donor and acceptor doped outer zone in one semiconductor member with an outer zone of a second semiconductor member of the same kind, the outer zone of the latter member containing only dopant for the conductance type opposed to that of the adjacent intermediate zone. The invention is also applicable with two semiconductor four-layer members in which both outer zones of one or both members, for example zone I and zone IV as well as zones I' and IV', are doped with impurity atoms of both types. With all of these various modifications, respectively different operating characteristics as exemplified by FIGS. 1*a*, 1*b* and 1*c* are obtainable simply by variation of the external connections 6, 7 and 8.

In the device schematically illustrated in FIG. 2 the electrically interconnected outer zones IV and I' of respective components A and B are adjacent to respective intermediate zones III and II' whose conductance types are opposed to each other. When a voltage of changing polarity is applied between the connections 6 and 7 or 7 and 8, an operating characteristic of the type shown in FIG. 1*a* is obtained. The breakdown voltages then correspond to the particular breakdown voltage of the intermediate p-n junction 2 or 3. When applying a voltage of alternating polarity between the connections 6 and 8, the general shape of the characteristic remains the same as when applying a voltage between connections 6 and 7 or 7 and 8, but the breakdown voltage is determined by the choice of the component semiconductor members interconnected at one of their respective outer zones. If the breakdown voltages of the junctions 2 and 3 and the blocking resistances for both components are equal, or if the blocking resistance and the breakdown voltage of one component is greater by the same factor than the blocking resistance and breakdown voltage of the other component, i.e., if the blocking resistances of the two components are in the same ratio as the corresponding breakdown voltages of the junctions 2 and 3, then the breakdown under a voltage $U_b$ impressed between the connections 6 and 8 will take place when this external voltage is equal to the sum of the breakdown voltages of junctions 2 and 3.

A device as exemplified by FIG. 2 can also be modified in various ways. For example, the two electrically interconnected outer zones may be doped with impurity atoms that produce the same conductance type and with impurity atoms that produce the opposed conductance type as compared with that of the adjacent intermediate zone. Thus, the zone IV of a p-n-p-x sequence may be connected with the zone I' of an x-n-p-n sequence. Furthermore, each of the electrically interconnected outer zones may be doped only with impurity atoms that produce a conductance type contrary to that of the adjacent intermediate zone. For example, the zone IV of an x-n-p-n sequence may be connected with the zone I' of a p-n-p-x sequence. In this case, too, both outer zones of one or more semiconductor components may be doped with donors as well as acceptors.

A particularly favorable embodiment of a semiconductor device according to the invention is shown in FIG. 3. The outer zones 13 and 19 to be interconnected are in mechanical and electrical contact with the metallic base plate 10 of a housing. The current supply leads for the device extend through the base plate and are insulated therefrom. This applies particularly to the leads 6 and 8 that are attached to the respective outer zones of the two semiconductor components, whereas the lead 7 need not necessarily pass through the plate 10. The layers 11 and 18, both of n-type conductance, are produced by diffusion in the semiconductor crystal consisting of silicon or germanium. The two outer layers 12 and 17 having p-type conductance as well as the layers 13 and 19 denoted by *x* are produced by alloying of acceptor metal into the p-type semiconductor body 20 or 21. The contact *x* of the two semiconductor components are electrically connected with each other by the metallic base plate 7. The connecting lead 7 is likewise electrically connected with the base plate 10 and constitutes the terminal connection for the two contacts *x*. The connecting leads 6, 7 and 8 pass vacuum tightly through the base plate. If desired, the base plate itself may serve as a connecting electrode or terminal for the contact *x*. A cup-shaped cover (not illustrated) may be placed over the base plate and fastened thereto in order to seal the device from the ambient atmosphere.

To those skilled in the art, it will be obvious upon a study of this disclosure that our invention is amenable to a variety of modifications with respect to materials, layer arrangement, design features and other details and hence can be given embodiments other than particularly illustrated and described herein, without departing from the essential features of our invention and within the scope of the claims annexed hereto.

We claim:

1. An electronic semiconductor device comprising two component semiconductor members each having four electrically sequentially zones alternately containing p-type and n-type impurity atoms respectively, each of said members containing in at least one of its two outer zones both types of impurity atoms and forming a substantially barrier-free junction with the adjacent zone; one of the two outer zones of one of said members having an electrically conductive interconnection with one of the two outer zones of said other member; and respective conductor means contacting said connection and the two other outer zones of said members.

2. In an electronic semiconductor device according to claim 1, said two semiconductor members having respective intermediate zones of the same conductance type adjacent to said electrically connected outer zones.

3. In an electronic semiconductor device according to claim 1, said two semiconductor members having respective intermediate zones of n-type and p-type conductance respectively adjacent to said electrically interconnected outer zones.

4. In an electronic semiconductor device according to claim 1, wherein both of said electrically interconnected outer zones contain donor as well as acceptor atoms.

5. In an electronic semiconductor device according to claim 1, at least one of said electrically interconnected outer zones containing only impurity atoms of a conductance-producing type opposed to that of the adjacent intermediate zone.

6. An electronic semiconductor device comprising two component semiconductor members each having four electrically sequential zones alternately containing p-type and n-type impurity atoms respectively, each of said members containing in at least one of its two outer zones both types of impurity atoms and having two p-n junctions of which an outer one is adjacent to the other outer zone whereas the other p-n junction is between the two intermediate zones, said one outer zone forming an essentially ohmic junction with the adjacent intermediate zone, said two outer p-n junctions having lower breakdown voltage than said other p-n junctions in said two component semiconductors; one of the two outer zones of one of said members having an electrically conductive interconnection with one of the two outer zones of said other member; and respective conductor means contacting said connection and the two other outer zones of said members.

7. In an electronic semiconductor device according to claim 6, one of said other p-n junctions between said intermediate zones of one of said semiconductor members having substantially the same breakdown voltage as said other p-n junctions of said other semiconductor members.

8. In an electronic semiconductor device according to claim 6, one of said other p-n junctions between said intermediate zones of one of said semiconductor members having a higher breakdown voltage than said other p-n junctions of said other semiconductor members.

9. An electronic semiconductor device according to claim 6, comprising a metallic housing plate, said two semiconductor members being mounted on said plate with said respective electrically interconnected outer zones in contact with said plate whereby said plate forms a conductive connection between said latter two zones as well as part of one of said conductor means, and said conductor means comprising two leads extending through said plate to said other outer zones respectively of said semiconductor members.

10. An electronic semiconductor device comprising two component semiconductor members each having four electrically sequential zones alternately containing p-type and n-type impurity atoms respectively, each of said members containing in one of its two outer zones both types of impurity atoms and forming a substantially barrier-free junction with the adjacent zone; said one outer zone of one of said members having an electrically conductive interconnection with one of the outer zones of said other member; and respective conductor means contacting said two other outer zones of said members.

References Cited by the Examiner

UNITED STATES PATENTS

| | | | |
|---|---|---|---|
| 2,623,105 | 12/52 | Shockley et al. | 307—88.5 |
| 2,855,524 | 10/58 | Shockley | 317—235 |
| 2,953,693 | 9/60 | Philips | 307—88.5 |
| 3,079,484 | 2/63 | Shockley et al. | 317—235 |

FOREIGN PATENTS

| | | |
|---|---|---|
| 212,376 | 12/60 | Australia. |

DAVID J. GALVIN, *Primary Examiner.*

ARTHUR GAUSS, *Examiner.*